(12) United States Patent
Ho

(10) Patent No.: US 8,772,907 B1
(45) Date of Patent: Jul. 8, 2014

(54) ANTI-FUSE STRUCTURE AND ANTI-FUSE PROGRAMMING METHOD

(71) Applicant: United Microelectronics Corp., Hsin-Chu (TW)

(72) Inventor: Chih-Yuan Ho, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/726,242

(22) Filed: Dec. 24, 2012

(51) Int. Cl.
*H01L 29/00* (2006.01)

(52) U.S. Cl.
USPC ............................................. 257/530

(58) Field of Classification Search
USPC .................................. 438/248, 391; 257/530
See application file for complete search history.

(56) References Cited

U.S. PATENT DOCUMENTS

| | | | |
|---|---|---|---|
| 7,785,984 B2 * | 8/2010 | Yamada et al. | 438/435 |
| 7,834,417 B2 | 11/2010 | Min et al. | |
| 8,049,299 B2 | 11/2011 | Min et al. | |
| 2006/0205164 A1 * | 9/2006 | Ko et al. | 438/296 |
| 2007/0194387 A1 * | 8/2007 | Dyer et al. | 257/369 |
| 2008/0067568 A1 * | 3/2008 | Abbasi et al. | 257/301 |
| 2011/0103127 A1 * | 5/2011 | Kurjanowicz | 365/96 |

* cited by examiner

*Primary Examiner* — Thao P Le
(74) *Attorney, Agent, or Firm* — Winston Hsu; Scott Margo

(57) ABSTRACT

An anti-fuse structure includes a substrate having at least a shallow trench isolation formed therein, a notch formed between the substrate and the STI, an electrode structure formed on the substrate, the electrode structure filling the notch, and a doped region formed in the substrate on a side of the electrode structure opposite to the notch.

10 Claims, 3 Drawing Sheets

ANTI-FUSE STRUCTURE AND ANTI-FUSE PROGRAMMING METHOD

BACKGROUND OF THE INVENTION

1. Field of the Invention

The invention relates to an anti-fuse structure and an anti-fuse programming method, and more particularly, to an anti-fuse structure and an anti-fuse programming method having a predictable rupture point.

2. Description of the Prior Art

Programmable read-only memory (PROM), field programmable read-only memory (FPROM), and one-time programmable non-volatile memory (OTP NUM) are forms of digital memory where the setting of each bit is locked by a fuse or an anti-fuse structure.

As one type of the one-time programmable memory element, the anti-fuse structure, which performs the opposite function to a fuse structure, is permanently programmed by providing a current exceeding a specified limit to "blow" the anti-fuse structure. For example, an anti-fuse structure consist of a transistor is programmed when the gate dielectric breakdown occurs. In other words, a rupture point in a location on the gate dielectric layer that shorts a word line to a bit line is always expected when programming the anti-fuse structure.

SUMMARY OF THE INVENTION

According to the claimed invention, an anti-fuse structure is provided. The anti-fuse structure includes a substrate having at least a shallow trench isolation (STI) formed therein, a notch formed between the substrate and the STI, an electrode structure formed on the substrate, the electrode structure filling the notch, and a doped region formed in the substrate on a side of the electrode structure opposite to the notch.

According to the claimed invention, an anti-fuse structure is provided. The anti-fuse structure includes a substrate having at least an insulating structure formed therein, a conductive layer formed on the substrate, the conductive layer comprising at least a first part covering a portion of the substrate and a portion of the insulating structure, and a doped region formed in the substrate on a side of the conductive layer opposite to the insulating structure.

According to the claimed invention, an anti-fuse programming method is further provided. The anti-fuse structure programming method first provides an anti-fuse structure. The anti-fuse structure includes a substrate having at least a STI formed therein, a notch formed between the substrate and the STI, an electrode structure formed on the substrate, the electrode structure filling the notch, and a doped region formed in the substrate on a side of the electrode structure opposite to the notch. Then, a programming voltage is provided to the anti-fuse structure and a rupture point located at the notch is formed according to the anti-fuse structure programming method.

According to the anti-fuse structure and anti-fuse programming method, the rupture point is located at the notch or at the bird's beak as expected. In other words, the rupture point of the anti-fuse structure is predictably limited.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a schematic drawing in a step subsequent to FIG. 1.

FIG. 5 is a schematic drawing in a step subsequent to FIG. 4.

DETAILED DESCRIPTION

Figure 1:
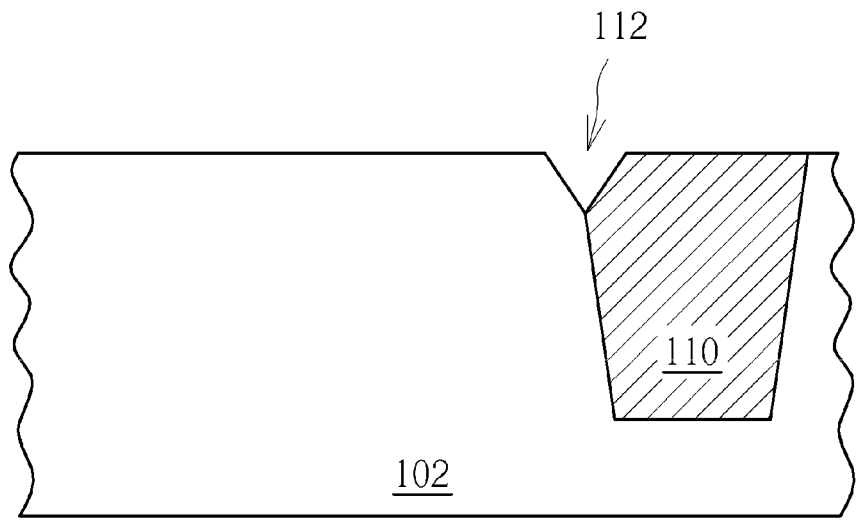
FIGS. 1-2 are schematic drawings illustrating an anti-fuse structure provided by a first preferred embodiment of the present invention.
Figure 2:
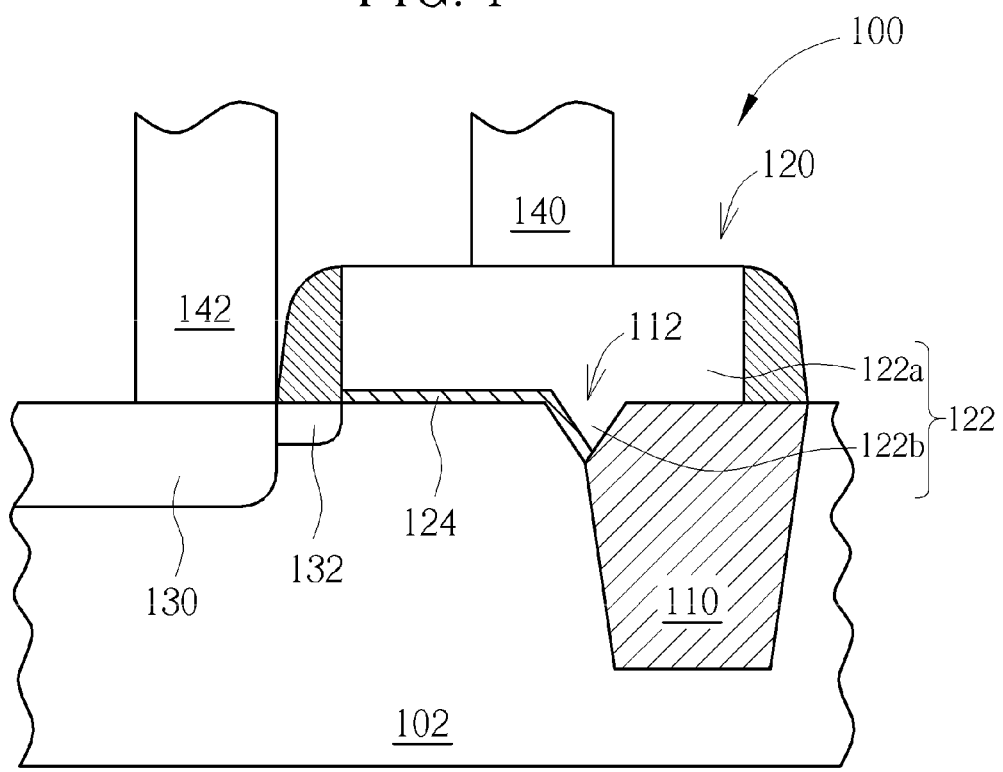
Figure 3:
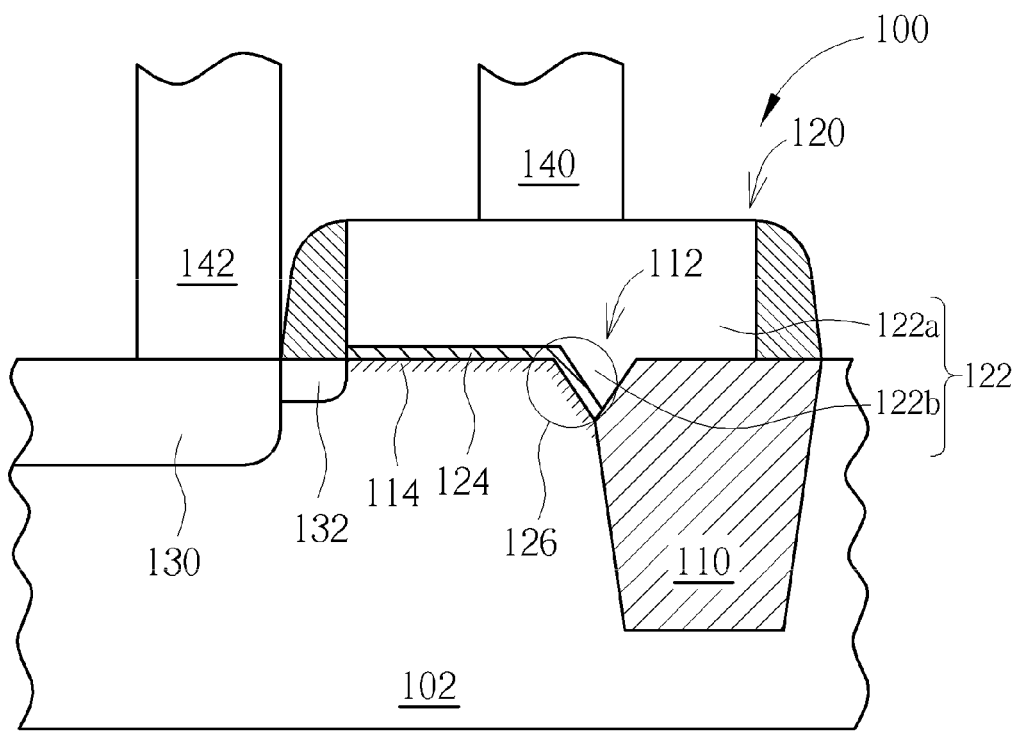
FIG. 3 is a schematic drawing illustrating an anti-fuse programming method provided by the first preferred embodiment of the present invention.

Please refer to FIGS. 1-3, wherein FIGS. 1-2 are schematic drawings illustrating an anti-fuse structure provided by a first preferred embodiment of the present invention and FIG. 3 is a schematic drawing illustrating an anti-fuse programming method provided by the first preferred embodiment of the present invention. As shown in FIG. 1, the preferred embodiment first provides a substrate 102. The substrate 102 can be a conventional semiconductor substrate, such as a bulk silicon substrate or an epitaxial silicon substrate, but not limited to this. At least an insulating structure such as a shallow trench isolation (STI) 110 is provided in the substrate 102. The STI 110 is formed by the following steps: a patterned hard mask (not shown) including at least a pad oxide layer and a silicon nitride layer is formed on the substrate 102. Then, a suitable etching process is performed to etch the substrate 102 through the patterned hard mask to form a recess (not shown) in the substrate 102 and followed by filling the recess with an insulating material. Subsequently, the superfluous insulating material and the patterned hard mask are removed, thus the STI 110 is obtained as shown in FIG. 1. It is well-known that a notch 112 between the substrate 102 and the STI 110 as shown in FIG. 1 is always formed after removing the pattern hard mask.

Please refer to FIG. 2. The anti-fuse structure 100 provided by the preferred embodiment includes an electrode structure 120 formed on the substrate 102 and a doped region 130 formed in the substrate 102 on a side of the electrode structure 120 opposite to the notch 110. Also, the anti-fuse structure 100 includes a lightly-doped drain (LDD) 132. In the preferred embodiment, the anti-fuse structure 100 is assumed to be a structure of n-type conductivity, therefore the doped region 130 and the LDD 132 include n-type dopants. However, those skilled in the art would easily realize that the anti-fuse structure 100 can be formed as a structure of p-type conductivity in accordance with different requirement, and thus the doped region 130 and the LDD 132 may include p-type dopant. The electrode structure 120, which serves as a word line, is electrically connected to a word line contact 140 and the doped region 130 is electrically connected to a bit line through a bit line contact 142. It is noteworthy that according to the preferred embodiment, the anti-fuse structure 100 always includes only one doped region 130 plus its LDD 132 for providing electrical connection between the word line and the bit line.

Please still refer to FIG. 2. The electrode structure 120 includes a conductive layer 122 and an insulating layer 124 sandwiched between the conductive layer 122 and the substrate 102. The conductive layer 122 includes polysilicon in the preferred embodiment, but not limited to this. The conductive layer 122 can be formed of other conductive materials such as metal. In other words, metal gate approach can be adopted in the preferred embodiment. The insulating layer 124 includes exemplarily a silicon oxide layer in the preferred embodiment, however the insulating layer 124 can include any suitable dielectric material. As shown in FIG. 2, the insulating layer 124 extends into the notch 112. More important, the insulating layer 124 includes a non-uniform thickness according to the preferred embodiment. Due to the defect and stress at the notch 112, the insulating layer 124 may have less thickness near and at the notch 112 compared to the thickness far away from the notch 112. The conductive layer 122 includes a first part 122a covering a portion of the substrate 102 and a portion of the STI 110. More important, the conductive layer 122 includes a second part 122b extended from the first part 122a and filling up the notch 112 as shown in FIG. 2. In other words, the second part 122b is formed in between the STI 110 and the substrate 102.

Please refer to FIG. 3. During programming, a programming voltage is provided and applied to the anti-fuse structure 100, thus a channel region 114 is formed as shown FIG. 3. It is noteworthy that the second part 122b, that is the notch 112 filled by the electrode structure 120, is the most vulnerable part of the electrode structure 120 because electrical fields concentrate at the sharp profile. Since the second part 122b obtains the highest electrical fields, a rupture point 126 of the insulating layer 124 is formed at the second part 122b, that is formed at the notch 112, when a programming voltage is applied. Consequently, the anti-fuse 100 is blown and programmed.

According to the anti-fuse structure 100 and the anti-fuse programming method provided by the first preferred embodiment, the second part 122b of the electrode structure 120 is formed to fill the notch 112 and thus the electrical fields concentrate at the second part 122b due the sharp profile of the notch 112. Accordingly, the rupture point 126 of the insulating layer 124 is easily limited and located at the second part 122b/the notch 112 during programming. Therefore, the anti-fuse structure 100 provided by the preferred embodiment has an advantage that the rupture point 126 of the insulating layer 124 is always predictably located at the second part 122b/the notch 112 as expected. Additionally, compared with the conventional insulating layer having constant thickness, the insulating layer 124 provided by the preferred embodiment can be formed to have a variable thickness and thus the manufacturing process is simplified.

Figure 4:
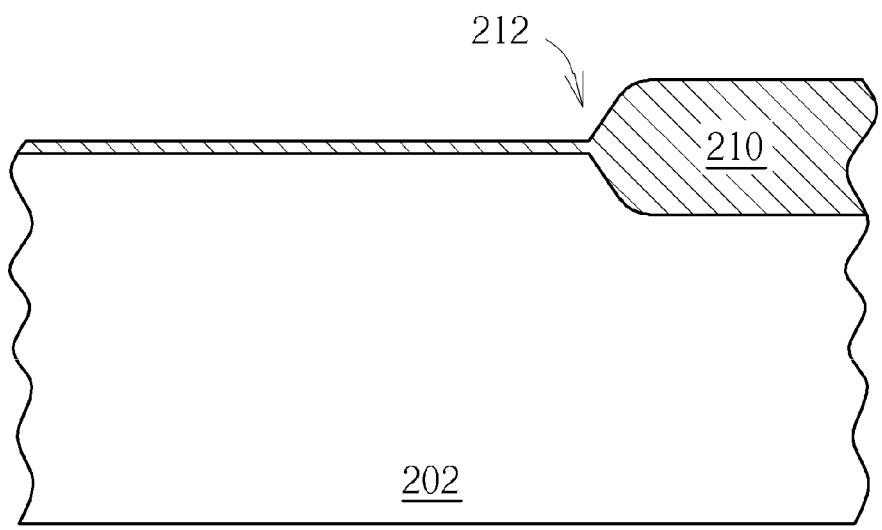
FIGS. 4-5 are schematic drawings illustrating an anti-fuse structure provided by a second preferred embodiment of the present invention.
Figure 5:
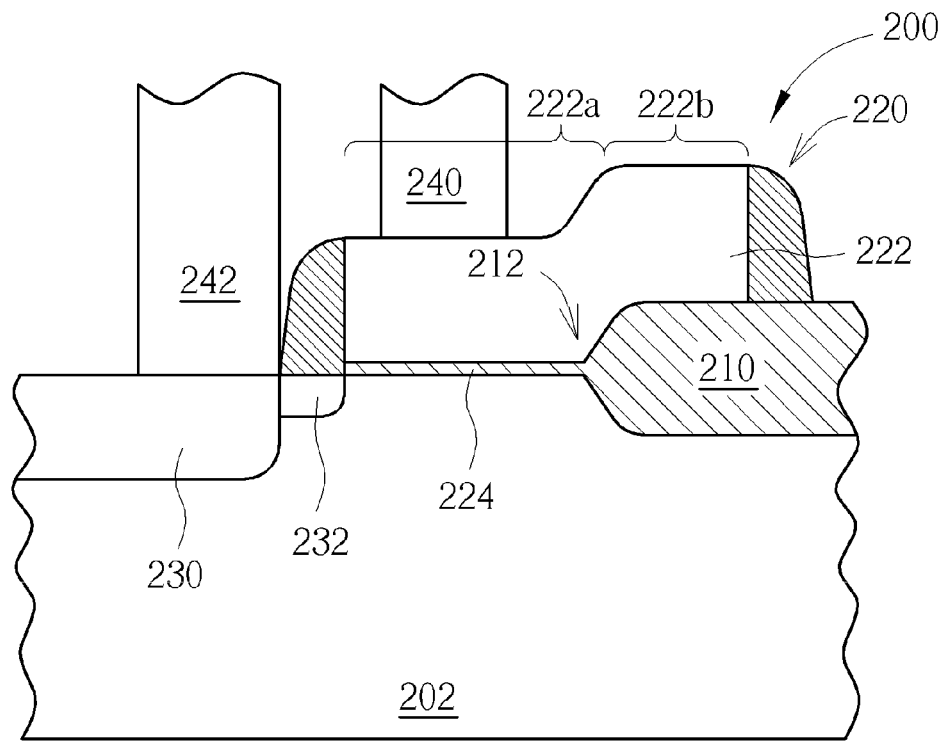
Figure 6:
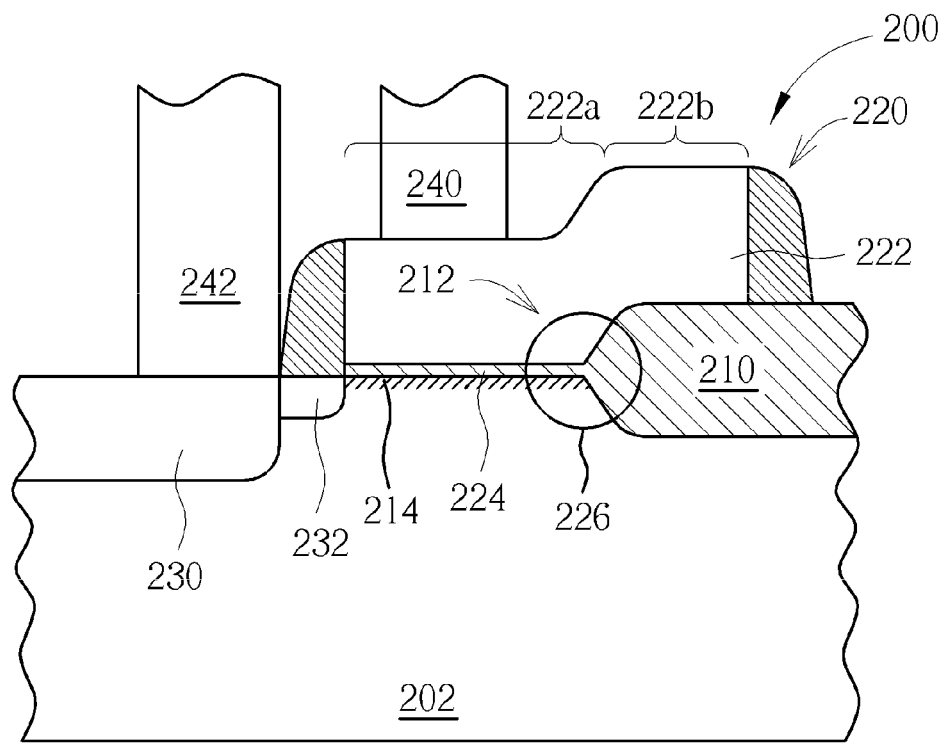
FIG. 6 is a schematic drawing illustrating an anti-fuse programming method provided by the second preferred embodiment of the present invention.

Please refer to FIGS. 4-6, wherein FIGS. 4-5 are schematic drawings illustrating an anti-fuse structure provided by a second preferred embodiment of the present invention and FIG. 6 is a schematic drawing illustrating an anti-fuse programming method provided by the second preferred embodiment of the present invention. It should be noted that elements the same in both of the first preferred embodiment and the second preferred embodiment include the same material, and thus those detail are omitted in the interest of brevity. As shown in FIG. 4, the preferred embodiment first provides a substrate 202, and the substrate 202 includes an insulating structure such as field oxide (FOX) structure 210 thereon. The FOX structure 210 is formed by performing a thermal oxidation to the substrate 202 and therefore at least a bird's beak portion 212 is always formed at the edge of the FOX structure 210 as shown in FIG. 4.

Please refer to FIG. 5. The anti-fuse structure 200 provided by the preferred embodiment includes an electrode structure 220 formed on the substrate 202 and a doped region 230 formed in the substrate 202 on a side of the electrode structure 220 opposite to the FOX structure 210. Also, the anti-fuse structure 200 includes a LDD 232. The electrode structure 220, which serves as a word line, is electrically connected to a word line contact 240 and the doped region 230 is electrically connected to a bit line through a bit line contact 242. It is noteworthy that according to the preferred embodiment, the anti-fuse structure 200 always includes only one doped region 230 plus its LDD 232 for providing electrical connection between the word line and the bit line.

Please still refer to FIG. 5. The electrode structure 220 includes a conductive layer 222 and an insulating layer 224 sandwiched between the conductive layer 222 and the substrate 202. As shown in FIG. 5, the electrode structure 220 covers a portion of the substrate 202 and a portion of the FOX structure 210. It is noteworthy that, since a top surface of the FOX structure 210 is higher than a surface of the substrate 202, the electrode structure 220 includes a lower part 222a located on the substrate 202 and a higher part 222b located on and raised by the FOX structure 210.

Please refer to FIG. 6. During programming, a programming voltage is provided and applied to the anti-fuse structure 200, thus a channel region 214 is formed as shown FIG. 6. However, it is noteworthy that an adjoining boundary between the lower part 222a and the higher part 222b is the most vulnerable part of the electrode structure 220 because electrical fields concentrate at this twisting configuration. Since the adjoining boundary obtains the highest electrical fields, a rupture point 226 of the insulating layer 224 is formed at the adjoining boundary between the lower part 222a and the higher part 222b, when a programming voltage is applied. Consequently, the anti-fuse 200 is blown and programmed. It should be noted that the adjoining boundary is formed corresponding to the bird's beak 212 of the FOX structure 210, therefore it is also taken that the rupture point 226 of the insulating layer 224 is formed at the bird's beak 212.

According to the anti-fuse structure 200 and the anti-fuse programming method provided by the second preferred embodiment, the electrical fields concentrate at the bird's beak 212/the adjoining boundary of the lower part 222a and the higher part 222b due to this twisting configuration. Accordingly, the rupture point 226 of the insulating layer 224 is easily limited and located at this adjoining boundary/the bird's beak 212 during programming. Therefore, the anti-fuse structure 200 provided by the preferred embodiment has an advantage that the rupture point 226 of the insulating layer 224 is always predictably located at the bird's beak 212/the adjoining boundary of the lower part 222a and the higher part 222b. Additionally, compared with the conventional insulating layer having constant thickness, the insulating layer 224 provided by the preferred embodiment can be formed to have a variable thickness and thus the manufacturing process is simplified.

According to the anti-fuse structure and anti-fuse programming method, the rupture point of the insulating layer is located at the notch or at the bird's beak as expected. In other words, the rupture point of the anti-fuse structure is predictably limited. Furthermore, since the rupture point of the insulating layer is located at the notch or at the adjoining boundary where the highest electrical fields are found, the insulating layer provided by the preferred embodiment can be formed to have a variable thickness and thus the manufacturing process is simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An anti-fuse structure comprising:
   a substrate having at least a shallow trench isolation (STI) formed therein;
   a notch formed between the substrate and the STI;
   a electrode structure formed on the substrate, the electrode structure filling the notch; and
   a doped region formed in the substrate on a side of the electrode structure opposite to the notch.

2. The anti-fuse structure according to claim 1, wherein the electrode structure comprising a conductive layer and an insulating layer.

3. The anti-fuse structure according to claim 2, wherein the insulating layer comprises a variable thickness.

4. The anti-fuse structure according to claim 2, wherein the insulating layer extends into the notch.

5. The anti-fuse structure according to claim 1, wherein the electrode structure covers a portion of the STI.

6. An anti-fuse programming method comprising:
   providing an anti-fuse structure, and the anti-fuse structure comprising:
   a substrate having at least a STI formed therein;
   a notch formed between the substrate and the STI;
   an electrode structure formed on the substrate, the electrode structure filling the notch; and
   a doped region formed in the substrate on a side of the electrode structure opposite to the notch;
   providing a programming voltage to the anti-fuse structure; and
   forming a rupture point located at the notch.

7. The anti-fuse programming method according to claim 6, wherein the electrode structure comprising a conductive layer and an insulating layer.

8. The anti-fuse programming method according to claim 7, wherein the insulating layer comprises a variable thickness.

9. The anti-fuse programming method according to claim 7, wherein the insulating layer extends into the notch.

10. The anti-fuse programming method according to claim 6, wherein the electrode structure covers a portion of the STI.

* * * * *